(12) United States Patent
Lee et al.

(10) Patent No.: US 12,532,624 B2
(45) Date of Patent: Jan. 20, 2026

(54) PIXEL WITH TRANSISTOR FOR RECEIVING VOLTAGE OF SCAN DRIVER Q NODE

(71) Applicant: Samsung Display Co., LTD., Yongin-si (KR)

(72) Inventors: Jaehyun Lee, Yongin-si (KR); Kiwon Park, Yongin-si (KR); Yeeun Kang, Yongin-si (KR); Seungrae Kim, Yongin-si (KR); Jongbum Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/431,907

(22) Filed: Feb. 2, 2024

(65) Prior Publication Data

US 2024/0373693 A1 Nov. 7, 2024

(30) Foreign Application Priority Data

May 4, 2023 (KR) .......................... 10-2023-0058662

(51) Int. Cl.
*H10K 59/13* (2023.01)
*G09G 3/32* (2016.01)
*H10K 59/121* (2023.01)
*H10K 59/131* (2023.01)

(52) U.S. Cl.
CPC ............. *H10K 59/131* (2023.02); *G09G 3/32* (2013.01); *H10K 59/1213* (2023.02); *G09G 2300/0426* (2013.01); *G09G 2300/0819* (2013.01); *G09G 2300/0852* (2013.01)

(58) Field of Classification Search
CPC .................. G09G 3/32; G09G 3/3233; G09G 2300/0819; G09G 2300/0852
See application file for complete search history.

(56) References Cited

U.S. PATENT DOCUMENTS

| 9,601,717 | B2 | 3/2017 | Lee et al. | |
| 2020/0159054 | A1* | 5/2020 | Jeong | ................... G02F 1/13336 |
| 2022/0375401 | A1* | 11/2022 | Kim | ....................... G09G 3/2085 |
| 2022/0406248 | A1* | 12/2022 | Ju | ......................... G09G 3/3258 |

FOREIGN PATENT DOCUMENTS

| CN | 112885850 | 6/2021 |
| KR | 10-2021-0049905 | 5/2021 |
| KR | 10-2022-0083912 | 6/2022 |

* cited by examiner

*Primary Examiner* — Liliana Cerullo
(74) *Attorney, Agent, or Firm* — Womble Bond Dickinson (US) LLP

(57) ABSTRACT

A pixel includes a first transistor including a first terminal configured to receive a driving voltage, a second terminal connected to a light-emitting diode, and a gate terminal connected to a node, a second transistor including a first terminal configured to receive a data voltage, a second terminal connected to the node, and a gate terminal configured to receive a scan signal, a third transistor including a first terminal configured to receive an initialization voltage, a second terminal connected to the light-emitting diode, and a gate terminal configured to receive a sensing signal, and a fourth transistor including a first terminal configured to receive a scan clock signal, a second terminal connected to the gate terminal of the second transistor, and a gate terminal configured to receive a voltage of a Q node.

6 Claims, 13 Drawing Sheets

PIXEL WITH TRANSISTOR FOR RECEIVING VOLTAGE OF SCAN DRIVER Q NODE

CROSS-REFERENCE TO RELATED APPLICATION

The present application claims priority to, and the benefit of, Korean Patent Application No. 10-2023-0058662, filed on May 4, 2023, in the Korean Intellectual Property Office (KIPO), the entire disclosure of which is incorporated herein by reference.

BACKGROUND

1. Field

Embodiments relate to a pixel, and to a display device including the same.

2. Description of the Related Art

A display device may display an image by including a driving element (e.g., a transistor) and a light-emitting element (e.g., an organic light-emitting diode) that emits light by receiving a voltage or signal from the driving element. To provide the voltage or signal to the light-emitting element, drivers, lines, or the like may be located in a non-display area of the display device.

An image may not be displayed in the non-display area where the light-emitting element is not located. The non-display area in which an image is not displayed is referred to as a dead space.

SUMMARY

Embodiments provide a pixel for reducing dead space.

Embodiments provide a display device including the pixel.

A pixel according to one or more embodiments of the present disclosure includes a first transistor including a first terminal configured to receive a driving voltage, a second terminal connected to a light-emitting diode, and a gate terminal connected to a node, a second transistor including a first terminal configured to receive a data voltage, a second terminal connected to the node, and a gate terminal configured to receive a scan signal, a third transistor including a first terminal configured to receive an initialization voltage, a second terminal connected to the light-emitting diode, and a gate terminal configured to receive a sensing signal, and a fourth transistor including a first terminal configured to receive a scan clock signal, a second terminal connected to the gate terminal of the second transistor, and a gate terminal configured to receive a voltage of a Q node.

The fourth transistor may be configured to output the scan signal that corresponds to the scan clock signal in response to the voltage of the Q node.

The second terminal of the fourth transistor may be directly connected to the gate terminal of the second transistor.

The pixel may further include a fifth transistor including a first terminal configured to receive a sensing clock signal, a second terminal connected to the gate terminal of the third transistor, and a gate terminal configured to receive the voltage of the Q node.

The fifth transistor may be configured to output the sensing signal that corresponds to the sensing clock signal in response to the voltage of the Q node.

The second terminal of the fifth transistor may be directly connected to the gate terminal of the third transistor.

A display device according to one or more embodiments of the present disclosure includes a substrate including a display area, and a non-display area adjacent to the display area, an active layer in the display area above the substrate, and including a first active pattern, and a second active pattern spaced apart from the first active pattern, a first conductive layer above the active layer, and including a first gate pattern at least partially overlapping the first active pattern in plan view, and a first gate line spaced apart from the first gate pattern, extending in a first direction, and configured to receive a sensing clock signal is applied, and a second conductive layer above the first conductive layer, and including a first connection pattern connected to the first gate line and to the first active pattern through contact holes, respectively, and a second connection pattern spaced apart from the first connection pattern, and connected to the first active pattern through a contact hole.

The first conductive layer may further include a second gate pattern at least partially overlapping the second active pattern in plan view, and a second gate line spaced apart from the second gate pattern, extending in the first direction, and configured to receive a scan clock signal.

The first gate pattern and the second gate pattern may be configured to receive a voltage of a Q node.

The display device may further include a scan driver in the non-display area above the substrate, wherein the first gate line and the second gate line are directly connected to the scan driver.

The second conductive layer may further include a third connection pattern connected to the second active pattern through a contact hole, and a fourth connection pattern spaced apart from the third connection pattern, and connected to the second active pattern and to the second gate line through contact holes, respectively.

The second conductive layer may further include a first scan line extending in a second direction crossing the first direction, at least partially overlapping the first gate line, and connected to the first gate pattern through a contact hole, and a second scan line extending in the second direction, at least partially overlapping the second gate line, and connected to the second gate pattern through a contact hole.

The first conductive layer may further include an initialization gate line extending in the first direction, connected to the second connection pattern through a contact hole, and configured to receive a sensing signal, and a switching gate line extending in the first direction, connected to the third connection pattern through a contact hole, and configured to receive a scan signal.

The initialization gate line may be spaced apart from the first scan line in plan view, wherein the switching gate line is spaced apart from the second scan line in plan view.

The display device may further include a lower conductive layer between the substrate and the active layer, and wherein the lower conductive layer includes a common voltage line extending in the first direction, and configured to receive a common voltage, and an initialization voltage line extending in the first direction, and configured to receive an initialization voltage, and wherein each of the first gate pattern and the first gate line is between the common voltage line and the initialization voltage line in plan view.

The lower conductive layer may further include a driving voltage line extending in the first direction, and configured to receive a driving voltage, and a data line extending in the first direction and configured to receive a data voltage, and wherein the second gate pattern and the second gate line are between the driving voltage line and the data line in plan view.

The active layer may further include a driving active pattern at least partially overlapping the driving voltage line in plan view, an initialization active pattern between the initialization voltage line and the driving voltage line in plan view, and a switching active pattern between the driving voltage line and the data line in plan view.

The driving active pattern may be electrically connected to the driving voltage line, wherein the initialization active pattern is electrically connected to the initialization voltage line, and wherein the switching active pattern is electrically connected to the data line.

The first conductive layer may further include a driving gate pattern at least partially overlapping the driving active pattern in plan view.

The lower conductive layer may further include a capacitor pattern at least partially overlapping the driving gate pattern in plan view, and defining a storage capacitor together with the driving gate pattern.

The driving active pattern and a portion of the driving gate pattern overlapping the driving active pattern may define a driving transistor, wherein the switching active pattern, and a portion of the switching gate line overlapping the switching active pattern, define a switching transistor, wherein the initialization active pattern, and a portion of the initialization gate line overlapping the initialization active pattern, define an initialization transistor, wherein the first active pattern, and a portion of the first gate pattern overlapping the first active pattern, define a first output transistor, and wherein the second active pattern, and a portion of the second gate pattern overlapping the second active pattern, define a second output transistor.

The first output transistor may be configured to output the sensing signal that corresponds to the sensing clock signal in response to a voltage of a Q node.

The second output transistor may be configured to output the scan signal that corresponds to the scan clock signal in response to a voltage of a Q node.

A display device according to embodiments of the present disclosure may include a plurality of pixels each including a transistor that outputs a scan signal that corresponds to a scan clock signal in response to a voltage of a Q node, and a transistor that outputs a sensing signal that corresponds to a sensing clock signal in response to the voltage of the Q node. Because each of the pixels includes transistors that output the scan signal and the sensing signal, a scan driver may include a relatively small number of transistors, and an area occupied by the scan driver may be reduced. Accordingly, the area of a non-display area in which the scan driver is located may be reduced, and thus a dead space of the display device may be reduced.

DETAILED DESCRIPTION

Figure 1:
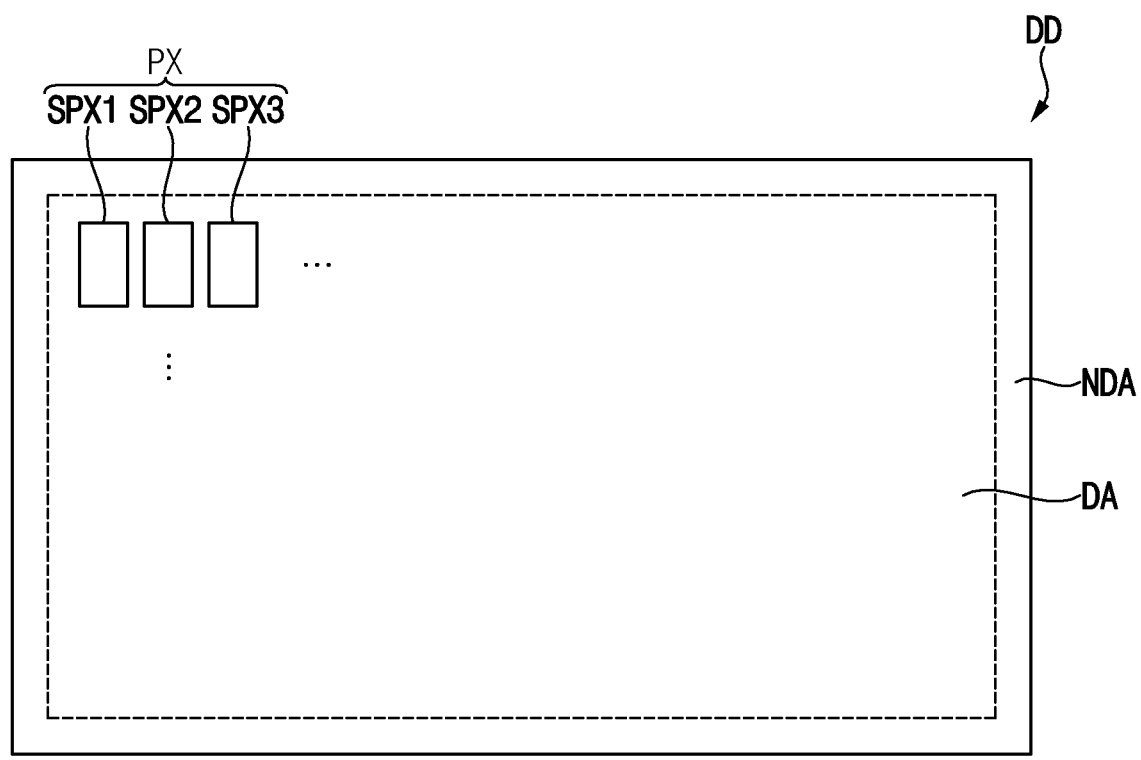
FIG. 1 is a plan view illustrating a display device according to one or more embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. It will be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
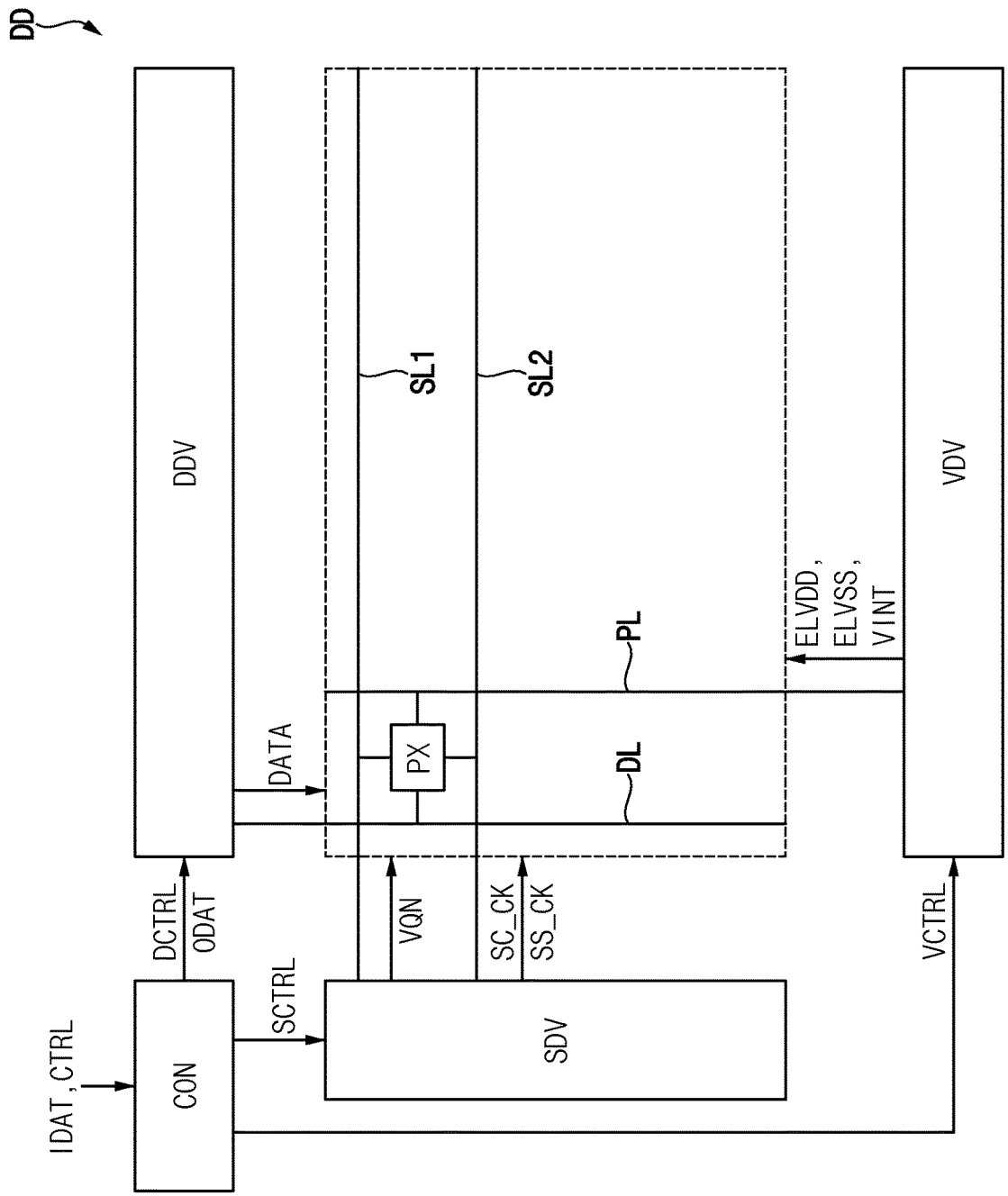
FIG. 2 is a block diagram illustrating the display device of FIG. 1.

FIG. 1 is a plan view illustrating a display device according to one or more embodiments of the present disclosure. FIG. 2 is a block diagram illustrating the display device of FIG. 1.

Referring to FIGS. 1 and 2, a display device DD may include a display area DA and a non-display area NDA.

The display area DA may be an area that displays an image by generating light. A plurality of pixels PX may be located in the display area DA. As the pixels PX emit light, the display area DA may display an image. Each of the pixels PX may include a first sub-pixel SPX1, a second sub-pixel SPX2, and a third sub-pixel SPX3.

In one or more embodiments, the first sub-pixel SPX1 may be a green sub-pixel that emits green light, the second sub-pixel SPX2 may be a red sub-pixel that emits red light, and the third sub-pixel SPX3 may be a blue sub-pixel that emits blue light. However, the color of light emitted from each of the sub-pixels SPX1, SPX2, and SPX3 is not limited thereto.

In addition, although each of the pixels PX is illustrated as including three sub-pixels SPX1, SPX2, and SPX3, the present disclosure is not limited thereto. For example, each of the pixels PX may further include a fourth sub-pixel that emits white light.

The pixels PX may be arranged in a matrix form along a first direction DR1, and along a second direction DR2 intersecting the first direction DR1. For example, the second direction DR2 may be perpendicular to the first direction DR1. Accordingly, each of the first sub-pixel SPX1, the second sub-pixel SPX2, and the third sub-pixel SPX3 may be arranged in a matrix form along the first direction DR1 and the second direction and DR2.

The non-display area NDA may be an area that does not display an image. The non-display area NDA may surround at least a portion of the display area DA. For example, the non-display area NDA may entirely surround the display area DA (e.g., in plan view). Drivers that provide signals and/or voltages to the pixels PX may be located in the non-display area NDA. For example, the drivers may include a scan driver SDV, a data driver DDV, a voltage driver VDV, and a controller CON.

Each of the pixels PX may be electrically connected to the scan driver SDV, the data driver DDV, and the voltage driver VDV. For example, each of the pixels PX may be connected to the scan driver SDV through a first scan line SL1 and a second scan line SL2, may be connected to the data driver DDV through a data line DL, and may be connected to the voltage driver VDV through a voltage line PL. Accordingly, each of the pixels PX may receive a voltage VQN of a Q node, a scan clock signal SC_CK, a sensing clock signal SS_CK, a data voltage DATA, a driving voltage ELVDD, a common voltage ELVSS, and an initialization voltage VINT. In this present disclosure, the Q node may be a node connected to a gate terminal of each of output transistors in a conventional scan driver.

The scan driver SDV may receive a scan control signal SCTRL from the controller CON. The scan driver SDV may generate the voltage VQN of the Q node, the scan clock signal SC_CK, and the sensing clock signal SS_CK based on the scan control signal SCTRL. The voltage VQN of the Q node may be provided to each of the pixels PX through the first scan line SL1. The scan clock signal SC_CK and the sensing clock signal SS_CK may be provided to each of the pixels PX through the second scan line SL2.

The data driver DDV may receive a data control signal DCTRL and an output image data ODAT from the controller CON. The data driver DDV may generate the data voltage DATA based on the data control signal DCTRL and the output image data ODAT. The data voltage DATA may be provided to each of the pixels PX through the data line DL.

The voltage driver VDV may receive a voltage control signal VCTRL from the controller CON. The voltage driver VDV may generate the driving voltage ELVDD, the common voltage ELVSS, and the initialization voltage VINT based on the voltage control signal VCTRL. The driving voltage ELVDD, the common voltage ELVSS, and the initialization voltage VINT may be provided to each of the pixels PX through the voltage line PL.

The controller CON may receive a control signal CTRL and an input image data IDAT from an external device (e.g., GPU). The controller CON may generate the scan control signal SCTRL, the data control signal DCTRL, the output image data ODAT, and the voltage control signal VCTRL based on the control signal CTRL and the input image data IDAT. The controller CON may control the scan driver SDV, the data driver DDV and the voltage driver VDV.

Figure 3:
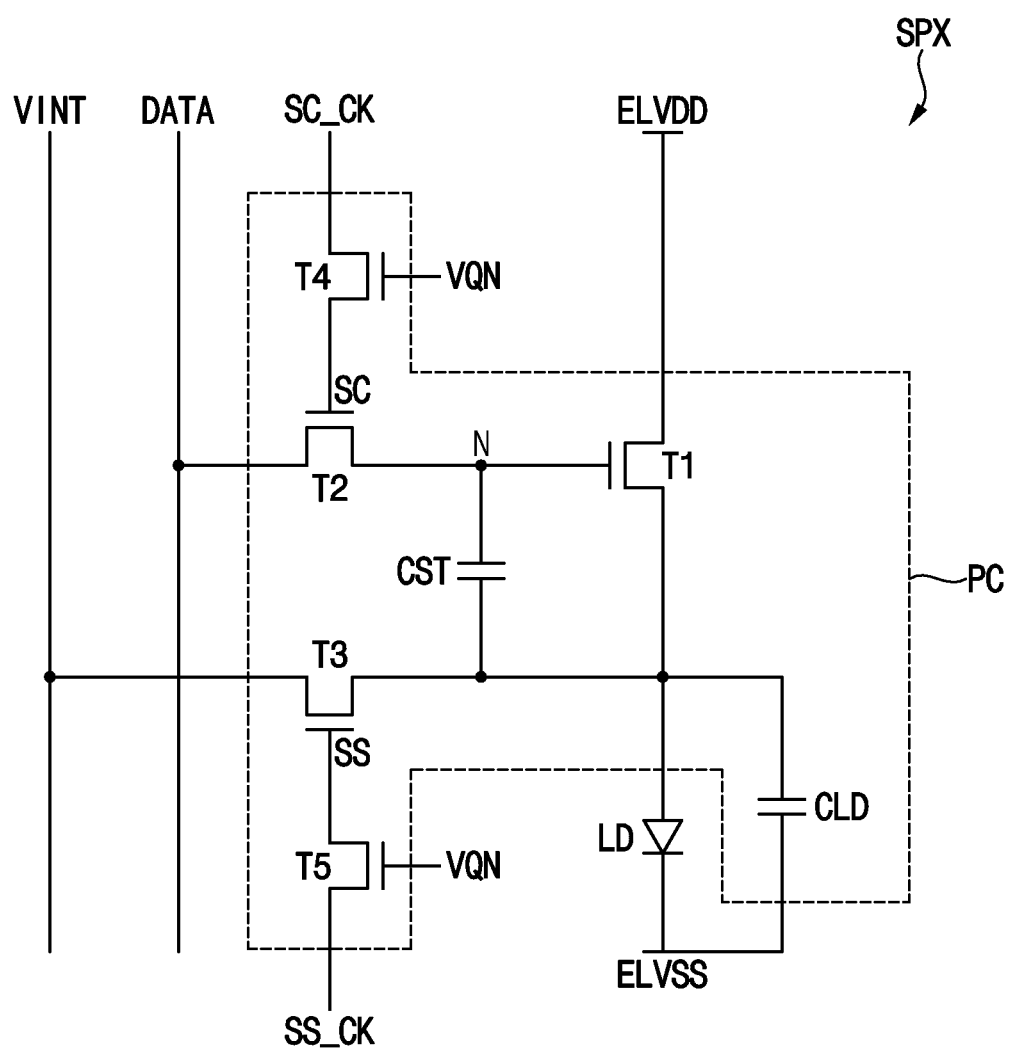
FIG. 3 is a circuit diagram illustrating a sub-pixel included in the display device of FIG. 1.

FIG. 3 is a circuit diagram illustrating a sub-pixel included in the display device of FIG. 1. For example, a sub-pixel SPX of FIG. 3 may correspond to any one of the first, second, and/or third sub-pixels SPX1, SPX2, and SPX3 of FIG. 1.

Referring to FIG. 3, the sub-pixel SPX may include a pixel circuit PC and a light-emitting diode LD electrically connected to the pixel circuit PC. The pixel circuit PC may include a first transistor T1, a second transistor T2, a third transistor T3, a fourth transistor T4, a fifth transistor T5, a storage capacitor CST, and a light-emitting capacitor CLD.

The first transistor T1 may include a gate terminal, a first terminal, and a second terminal. The gate terminal of the first transistor T1 may be connected to a node N. The first terminal of the first transistor T1 may receive the driving voltage ELVDD. The second terminal of the first transistor T1 may be connected to a first terminal of the light-emitting diode LD. The first transistor T1 may receive the driving voltage ELVDD in response to a voltage of the node N, and may supply a driving current to the light-emitting diode LD. For example, the first transistor T1 may be a driving transistor that drives the light-emitting diode LD.

The second transistor T2 may include a gate terminal, a first terminal, and a second terminal. The gate terminal of the second transistor T2 may receive a scan signal SC. The first terminal of the second transistor T2 may receive the data voltage DATA. The second terminal of the second transistor T2 may be connected to the node N. The second transistor T2 may transmit the data voltage DATA in response to the scan signal SC. For example, the second transistor T2 may be a switching transistor.

The third transistor T3 may include a gate terminal, a first terminal, and a second terminal. The gate terminal of the third transistor T3 may receive a sensing signal SS. The first terminal of the third transistor T3 may receive the initialization voltage VINT. The second terminal of the third transistor T3 may be connected to the first terminal of the light-emitting diode LD. The third transistor T3 may transmit the initialization voltage VINT in response to the sensing signal SS. For example, the third transistor T3 may be an initialization transistor.

The fourth transistor T4 may include a gate terminal, a first terminal, and a second terminal. The gate terminal of the fourth transistor T4 may receive the voltage VQN of the Q node. The first terminal of the fourth transistor T4 may receive the scan clock signal SC_CK. The second terminal of the fourth transistor T4 may be connected to the gate terminal of the second transistor T2. The fourth transistor T4 may output the scan signal SC that corresponds to the scan clock signal SC_CK in response to the voltage VQN of the Q node. In one or more embodiments, the second terminal of the fourth transistor T4 may be directly connected to the gate terminal of the second transistor T2. Accordingly, the gate terminal of the second transistor T2 may receive the scan signal SC output from the fourth transistor T4. For example, the fourth transistor T4 may be an output transistor.

The fifth transistor T5 may include a gate terminal, a first terminal, and a second terminal. The gate terminal of the fifth transistor T5 may receive the voltage VQN of the Q node. The first terminal of the fifth transistor T5 may receive the sensing clock signal SS_CK. The second terminal of the fifth transistor T5 may be connected to the gate terminal of the third transistor T3. The fifth transistor T5 may output the sensing signal SS that corresponds to the sensing clock signal SS_CK in response to the voltage VQN of the Q node. In one or more embodiments, the second terminal of the fifth transistor T5 may be directly connected to the gate terminal of the third transistor T3. Accordingly, the gate terminal of the third transistor T3 may receive the sensing signal SS output from the fifth transistor T5. For example, the fifth transistor T5 may be an output transistor.

The storage capacitor CST may include a first terminal and a second terminal. The first terminal of the storage capacitor CST may be connected to the node N. The second terminal of the storage capacitor CST may be connected to the first terminal of the light-emitting diode LD. The storage capacitor CST may store a difference voltage between a gate voltage and a source voltage of the first transistor T1.

The light-emitting capacitor CLD may include a first terminal and a second terminal. The first terminal of the light-emitting capacitor CLD may be connected to the first terminal of the light-emitting diode LD. The second terminal of the light-emitting capacitor CLD may be connected to the second terminal of the light-emitting diode LD. The light-emitting capacitor CLD may maintain a constant voltage across the light-emitting diode LD, so that the light-emitting diode LD may display relatively constant luminance. Alternatively, the light-emitting capacitor CLD may be omitted.

The light-emitting diode LD may include the first terminal (e.g., an anode electrode) and the second terminal (e.g., a cathode electrode). The first terminal of the light-emitting diode LD may be connected to the second terminal of the first transistor T1. The second terminal of the light-emitting diode LD may receive the common voltage ELVSS. The light-emitting diode LD may emit light with a luminance that corresponds to the driving current provided from the pixel circuit PC.

In FIG. 3, one pixel circuit PC is illustrated as including five transistors T1, T2, T3, T4, and T5 and two capacitors CST and CLD, but the present disclosure is not limited thereto. For example, one pixel circuit PC may include four or fewer transistors, or six or more transistors, or one, three, or more capacitors.

In addition, in FIG. 3, one sub-pixel SPX is illustrated as including one light-emitting diode LD, but the present disclosure is not limited thereto. For example, one sub-pixel SPX may include two or more light-emitting diodes.

Figure 4:
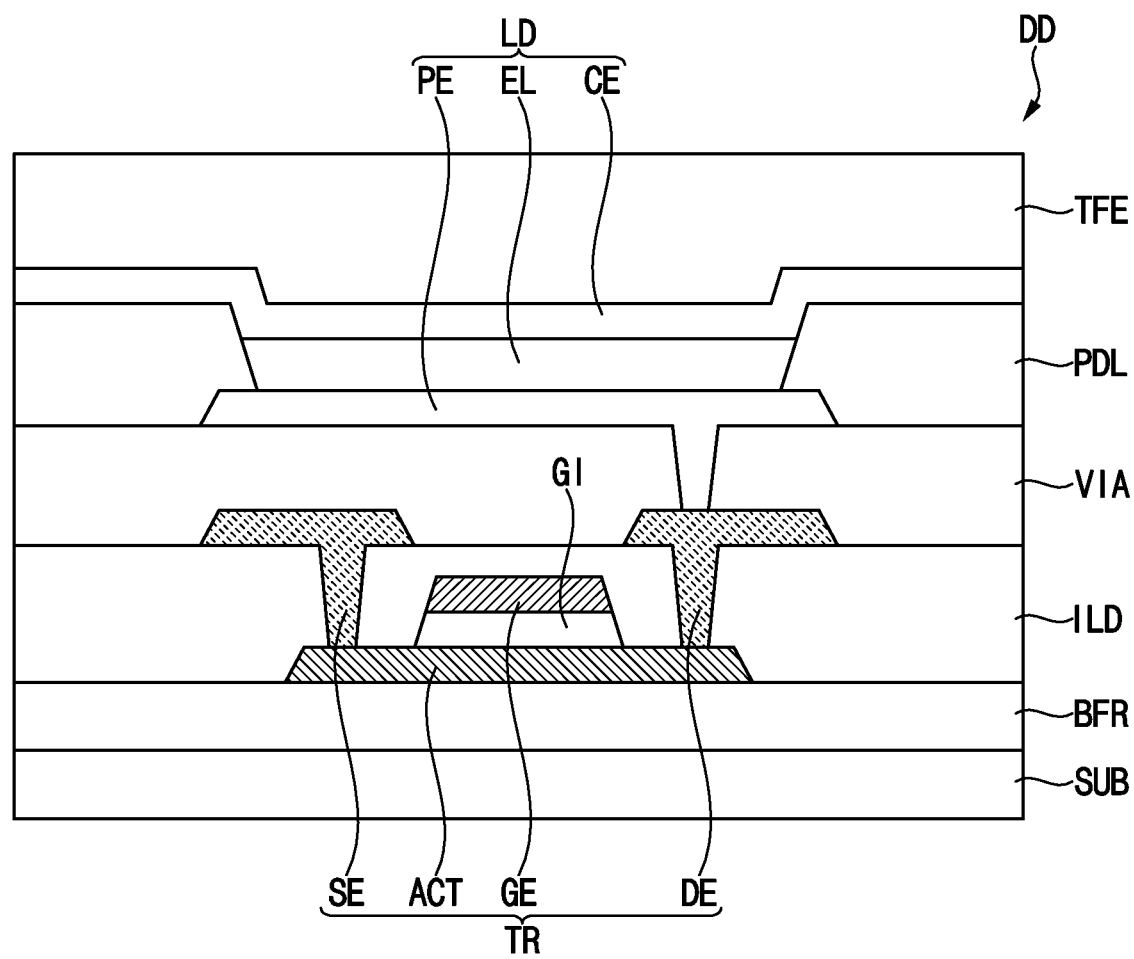
FIG. 4 is a cross-sectional view illustrating the display device of FIG. 1.

FIG. 4 is a cross-sectional view illustrating the display device of FIG. 1.

Referring to FIG. 4, the display device DD may include a substrate SUB, a buffer layer BFR, a transistor TR, a gate-insulating layer GI, an interlayer insulating layer ILD, a via insulating layer VIA, the light-emitting diode LD, a pixel-defining layer PDL, and an encapsulation layer TFE.

The transistor TR may include an active pattern ACT, a gate electrode GE, a source electrode SE, and a drain electrode DE. The light-emitting diode LD may include a pixel electrode PE, a light-emitting layer EL, and a common electrode CE.

The substrate SUB may include a transparent material or an opaque material. For example, the substrate SUB may include a rigid glass substrate, a polymer substrate, a flexible film, a metal substrate, or the like. These may be used alone or in combination with each other.

The buffer layer BFR may be located on the substrate SUB. The buffer layer BFR may reduce or prevent diffusion of metal atoms or impurities from the substrate SUB into the transistor TR. In addition, when a surface of the substrate SUB is not uniform, the buffer layer BFR may improve flatness of the surface of the substrate SUB. The buffer layer BFR may include an inorganic material, such as silicon oxide ($SiO_x$), silicon carbide ($SiC_x$), silicon oxynitride ($SiO_xN_y$), silicon oxycarbide ($SiO_xC_y$), or the like. These may be used alone or in combination with each other.

The active pattern ACT may be located on the buffer layer BFR. The active pattern ACT may include a source area, a drain area, and a channel area positioned between the source area and the drain area. The active pattern ACT may include a silicon semiconductor material or an oxide semiconductor material. Examples of the silicon semiconductor material may include amorphous silicon, polycrystalline silicon, or the like. Examples of the oxide semiconductor material may include indium gallium zinc oxide (IGZO), indium tin zinc oxide (ITZO), or the like. These may be used alone or in combination with each other.

The gate-insulating layer GI may be located on the active pattern ACT. The gate-insulating layer GI may overlap the channel area of the active pattern ACT. The gate-insulating layer GI may include an inorganic material, such as silicon oxide, silicon nitride, silicon carbide, silicon oxynitride, silicon oxycarbide, or the like. These may be used alone or in combination with each other.

The gate electrode GE may be located on the gate-insulating layer GI. The gate electrode GE may overlap the channel area of the active pattern ACT. The gate electrode GE may include a metal, a conductive metal oxide, a metal nitride, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. Examples of the conductive metal oxide may include indium tin oxide (ITO), indium zinc oxide (IZO), or the like. Examples of the metal nitride may include aluminum nitride ($AlN_x$), tungsten nitride ($WN_x$), chromium nitride ($CrN_x$), or the like. These may be used alone or in combination with each other.

The interlayer insulating layer ILD may be located on the buffer layer BFR. The interlayer insulating layer ILD may sufficiently cover the gate electrode GE, and may have a substantially flat upper surface without creating a step around the gate electrode GE. Alternatively, the interlayer insulating layer ILD may cover the gate electrode GE, and may be located along a profile of the gate electrode GE with a substantially uniform thickness. The interlayer insulating layer ILD may include an inorganic material, such as silicon oxide, silicon nitride, silicon carbide, silicon oxynitride, silicon oxycarbide, or the like. These may be used alone or in combination with each other.

The source electrode SE and the drain electrode DE may be located on the interlayer insulating layer ILD. The source electrode SE may contact the source area of the active pattern ACT through a contact hole penetrating a first portion of the interlayer insulating layer ILD. In addition, the drain electrode DE may contact the drain area of the active pattern ACT through a contact hole penetrating a second portion of the interlayer insulating layer ILD. Each of the source electrode SE and the drain electrode DE may include a metal, an alloy, a metal nitride, a conductive metal oxide, a transparent conductive material, or the like. These may be used alone or in combination with each other.

Accordingly, the transistor TR including the active pattern ACT, the gate electrode GE, the source electrode SE, and the drain electrode DE may be located on the substrate SUB.

The via insulating layer VIA may be located on the interlayer insulating layer ILD. The via insulating layer VIA may sufficiently cover the source electrode SE and the drain electrode DE. The via insulating layer VIA may include an organic material, such as phenolic resin, polyacrylates resin, polyimide resin, polyamides resin, siloxane resin, epoxy resin, or the like. These may be used alone or in combination with each other.

The pixel electrode PE may be located on the via insulating layer VIA. The pixel electrode PE may contact the drain electrode DE through a contact hole penetrating the via insulating layer VIA. The pixel electrode PE may include a metal, an alloy, a metal nitride, a conductive metal oxide, a transparent conductive material, or the like. These may be used alone or in combination with each other. For example, the pixel electrode PE may function as an anode.

The pixel-defining layer PDL may be located on the via insulating layer VIA. An opening exposing at least a portion of an upper surface of the pixel electrode PE may be defined in the pixel-defining layer PDL. The pixel-defining layer PDL may include an organic material, such as photoresist, polyacrylic resin, polyimide resin, polyamide resin, siloxane resin, acrylic resin, epoxy resin, or the like. These may be used alone or in combination with each other.

The light-emitting layer EL may be located on the pixel electrode PE. For example, the light-emitting layer EL may be located in the opening of the pixel-defining layer PDL. The light-emitting layer EL may include an organic light-emitting material that emits light of a corresponding color (e.g., predetermined color). For example, the light-emitting layer EL may include an organic light-emitting material that emits red light, green light, and/or blue light.

The common electrode CE may be located on the light-emitting layer EL and the pixel-defining layer PDL. The common electrode CE may be a plate electrode. The common electrode CE may include a metal, an alloy, a metal nitride, a conductive metal oxide, a transparent conductive material, or the like. These may be used alone or in combination with each other. For example, the common electrode CE may function as a cathode.

Accordingly, the light-emitting diode LD including the pixel electrode PE, the light-emitting layer EL and the common electrode CE may be located on the substrate SUB. The light-emitting diode LD may be electrically connected to the transistor TR.

The encapsulation layer TFE may be located on the common electrode CE. The encapsulation layer TFE may protect the light-emitting diode LD from external oxygen and moisture. The encapsulation layer TFE may include at least one inorganic layer and at least one organic layer. For example, the encapsulation layer TFE may include a first inorganic layer located on the common electrode CE, an organic layer located on the first inorganic layer, and a second inorganic layer located on the organic layer.

Figure 12:
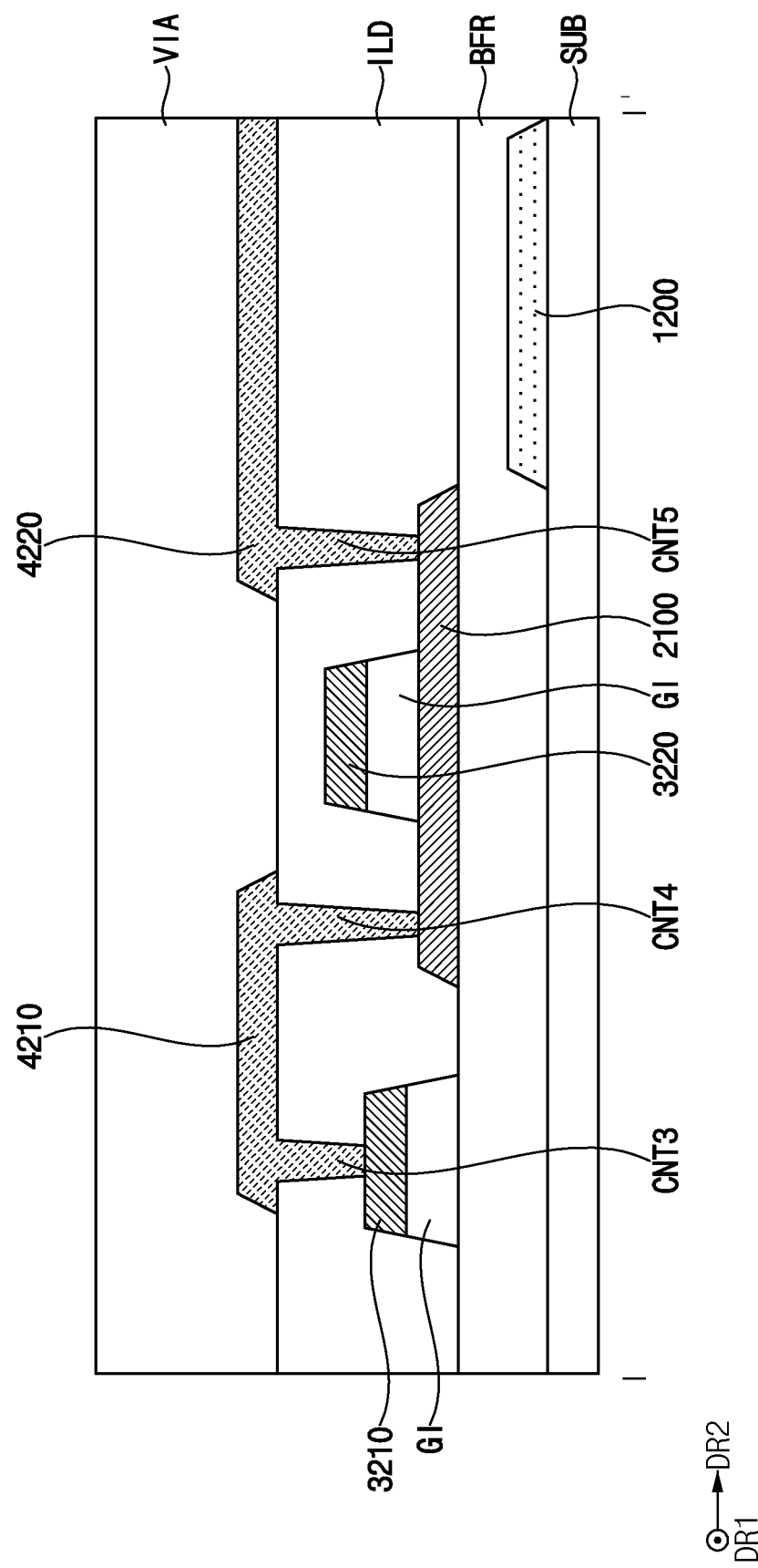
FIG. 12 is a cross-sectional view taken along the line I-I' of FIG. 11.
Figure 13:
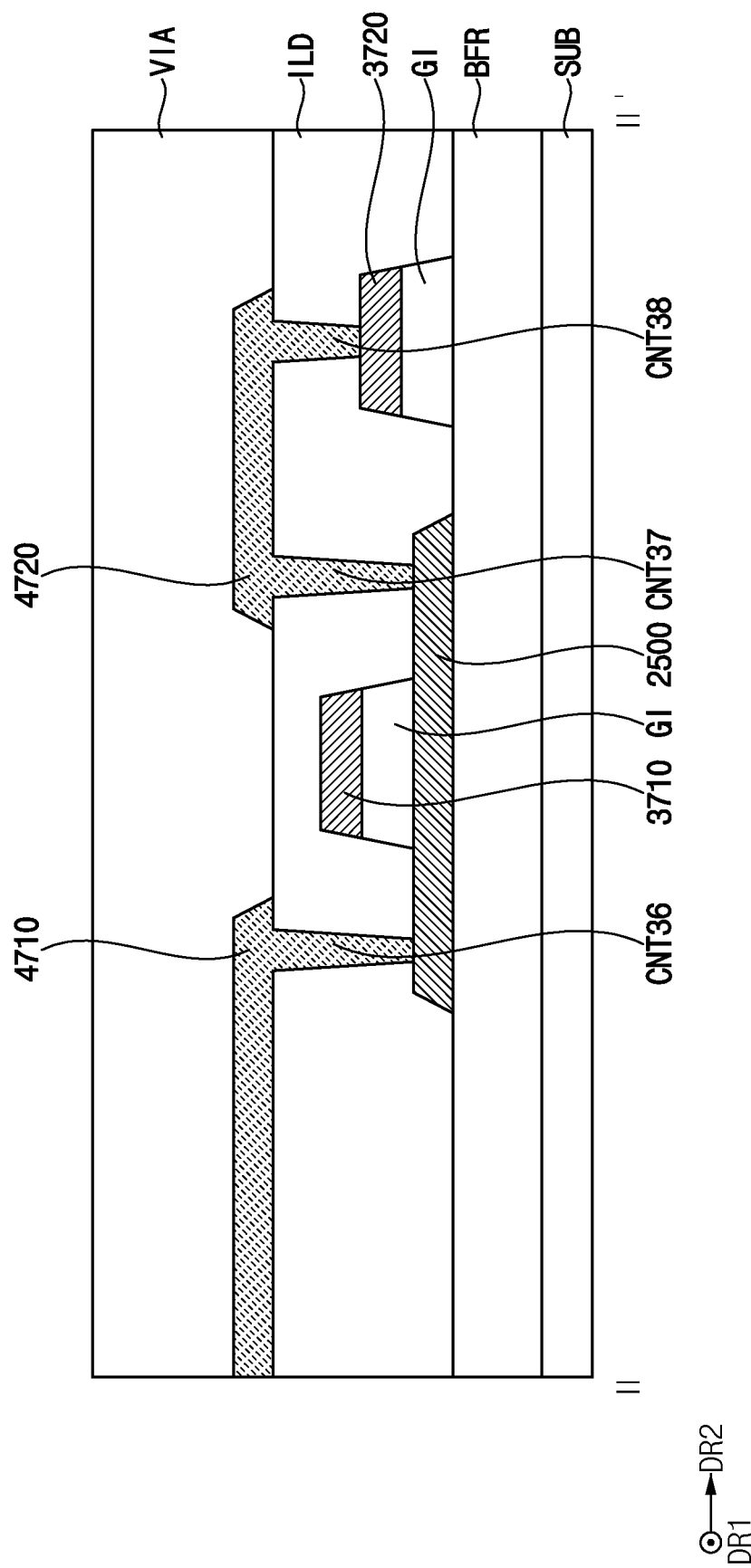
FIG. 13 is a cross-sectional view taken along the line II-II' of FIG. 11.

FIGS. 5, 6, 7, 8, 9, 10, and 11 are layout views illustrating a pixel included in the display device of FIG. 1. FIG. 12 is a cross-sectional view taken along the line I-I' of FIG. 11. FIG. 13 is a cross-sectional view taken along the line II-II' of FIG. 11.

Hereinafter, a layer-by-layer structure of one pixel PX included in the display device DD will be described in detail with reference to FIGS. 5 to 13.

Figure 5:
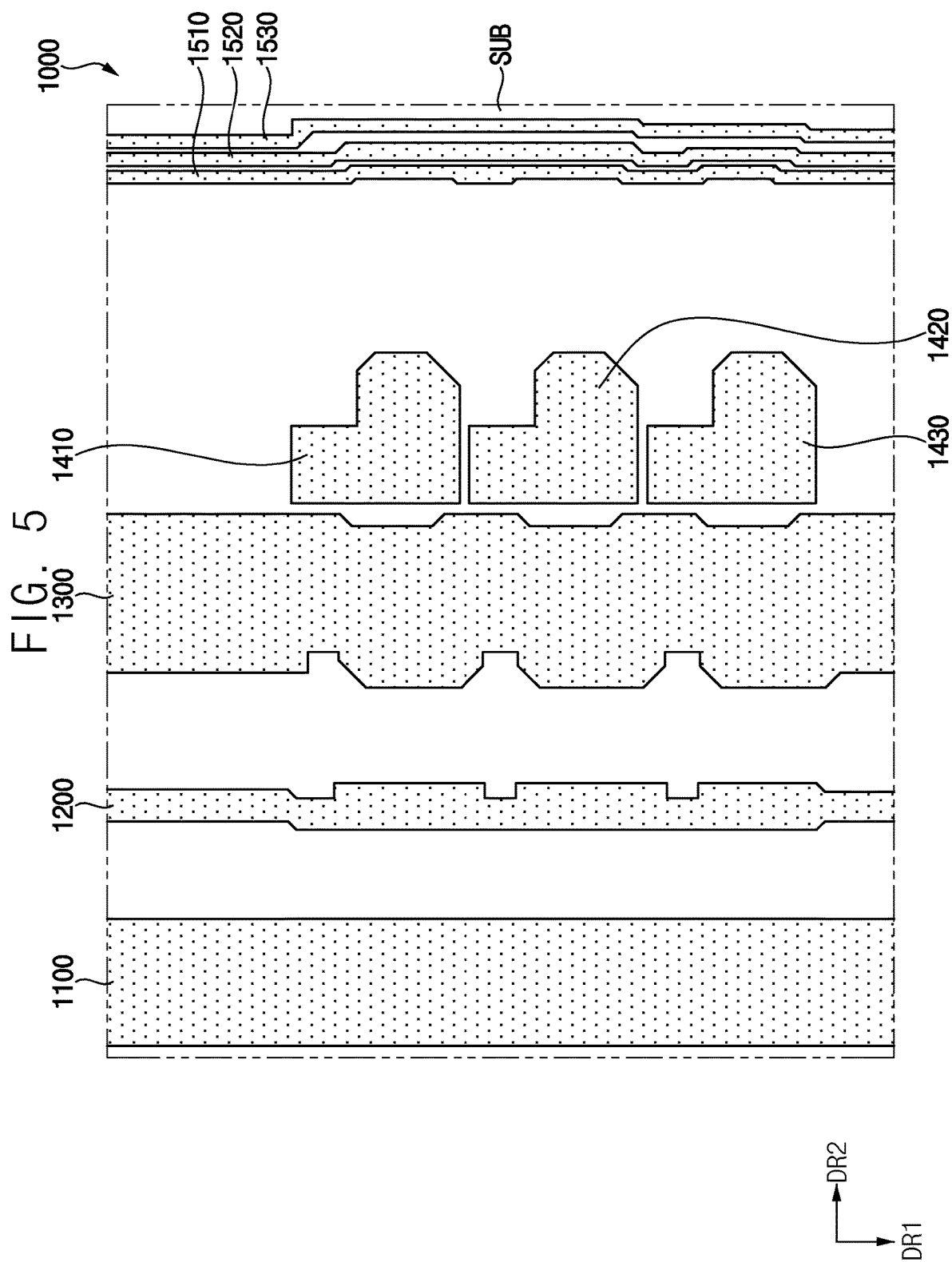
FIGS. 5, 6, 7, 8, 9, 10, and 11 are layout views illustrating a pixel included in the display device of FIG. 1.
Figure 6:
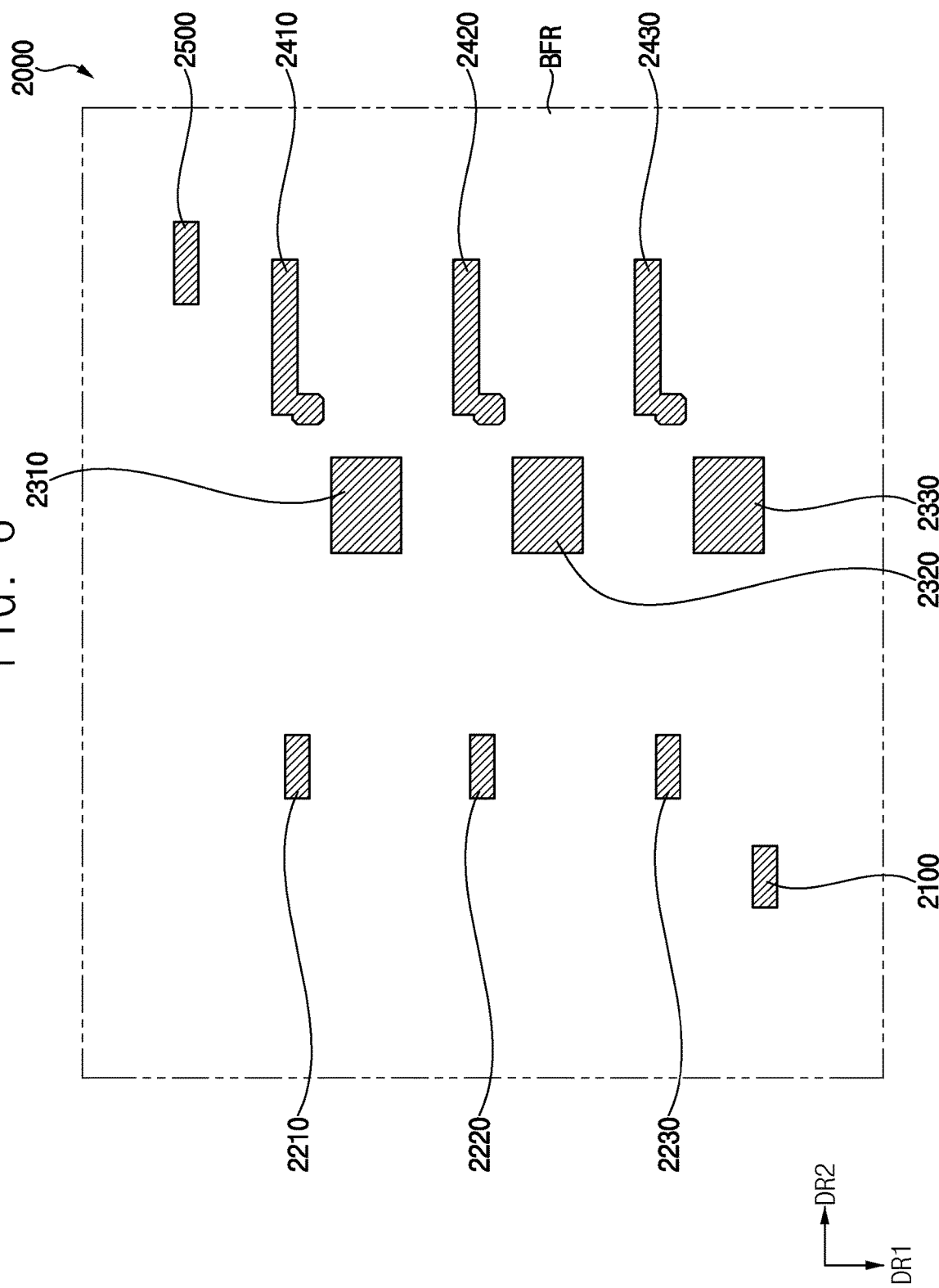
Figure 7:
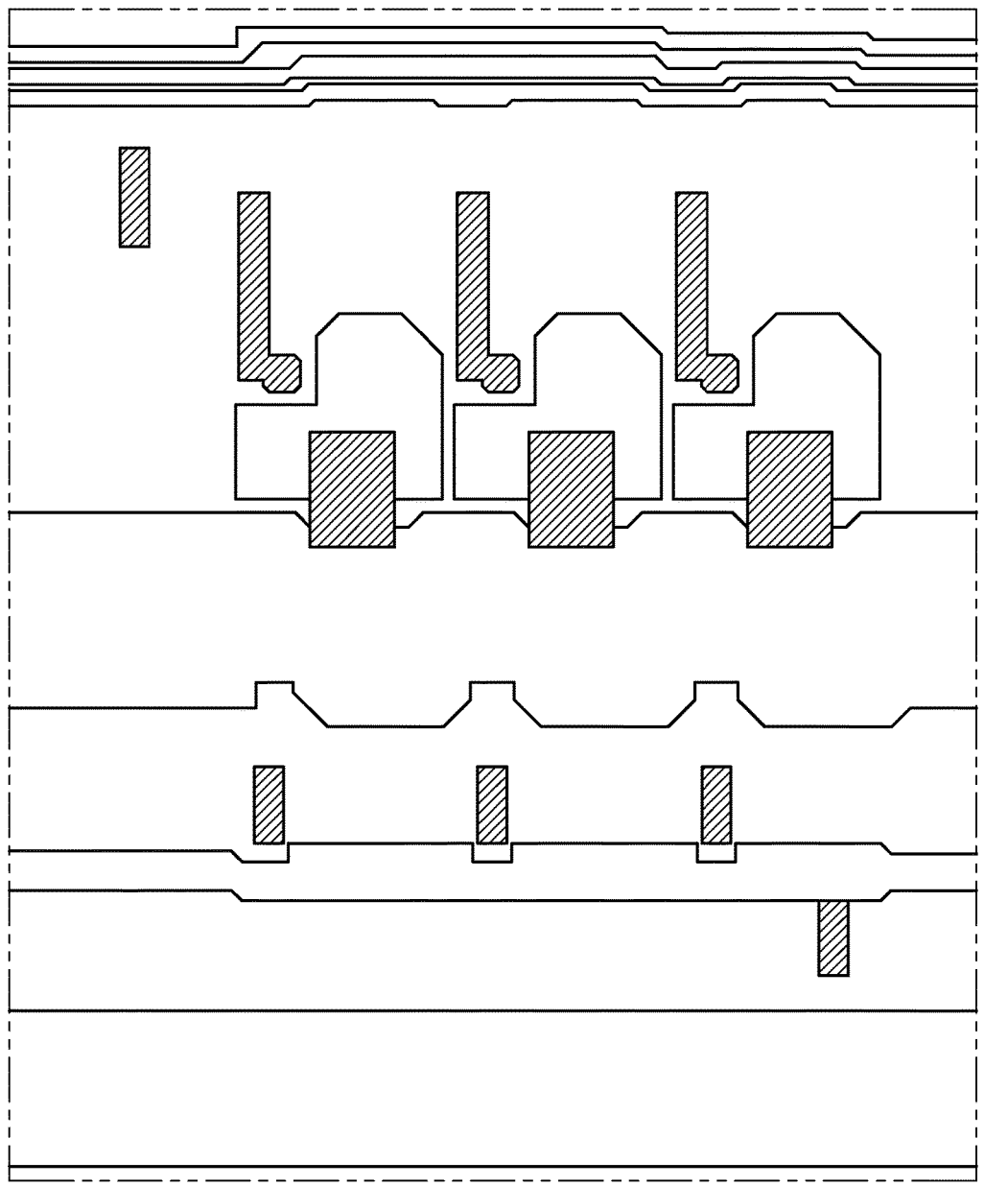
Figure 8:
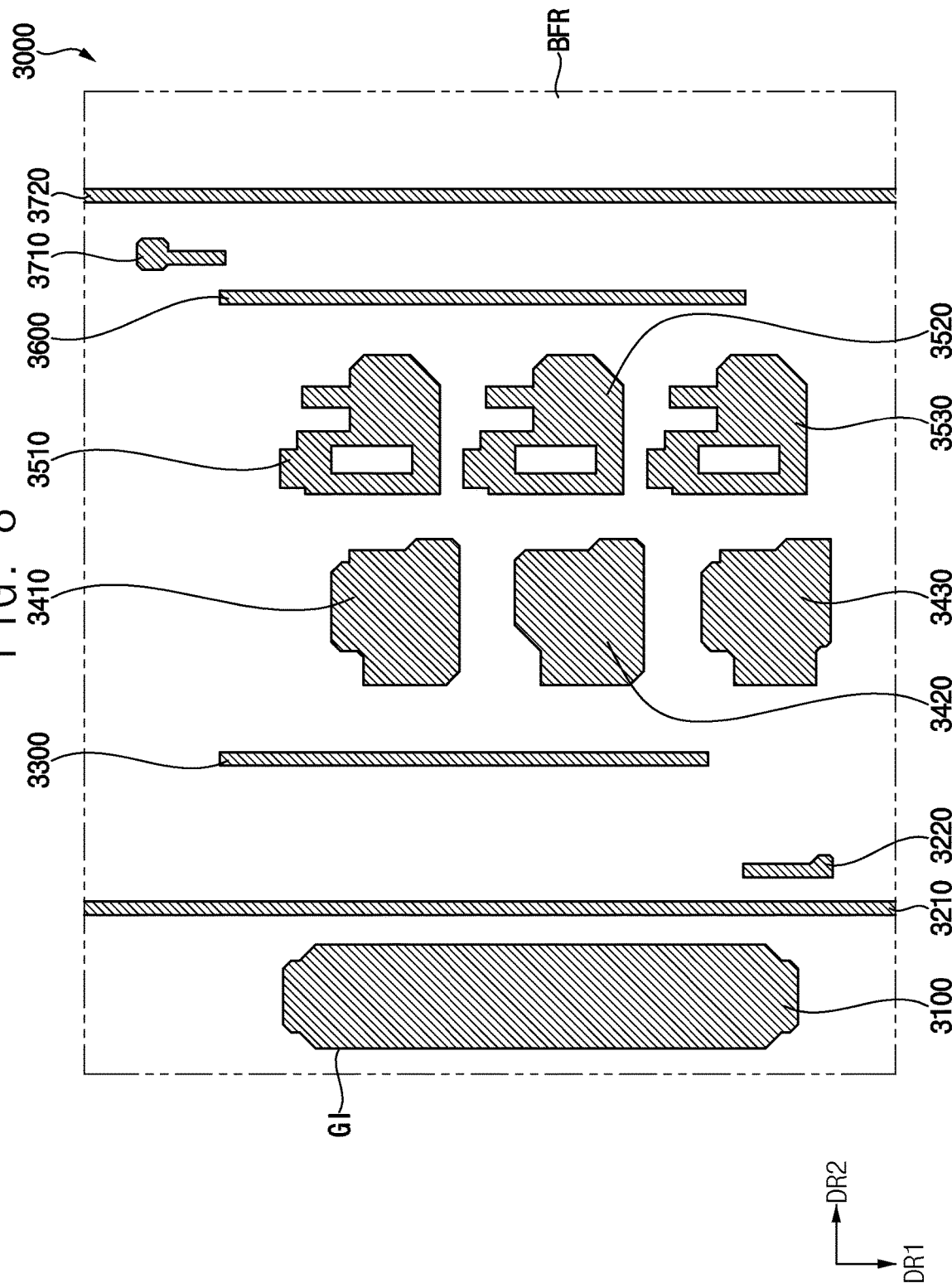
Figure 9:
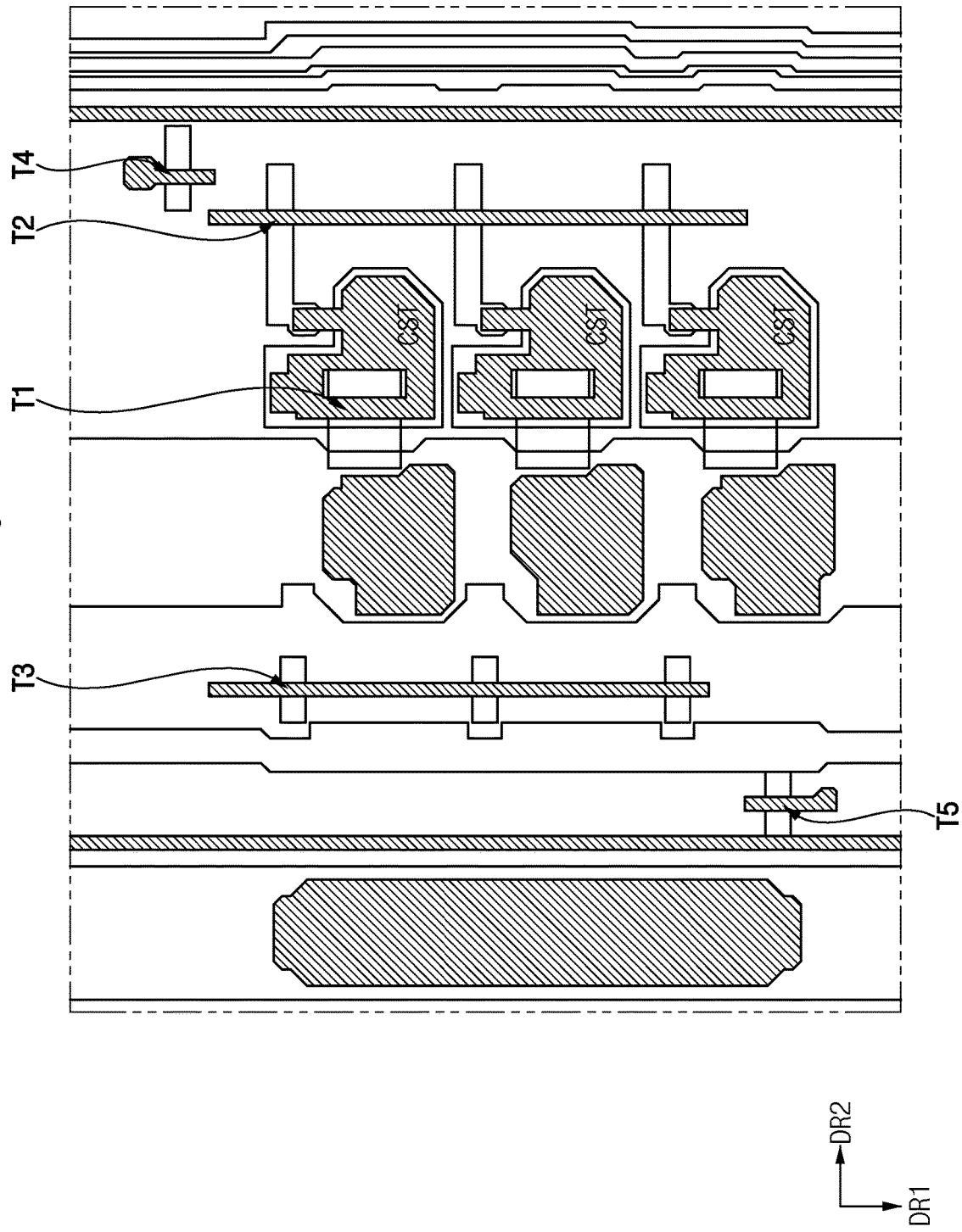
Figure 10:
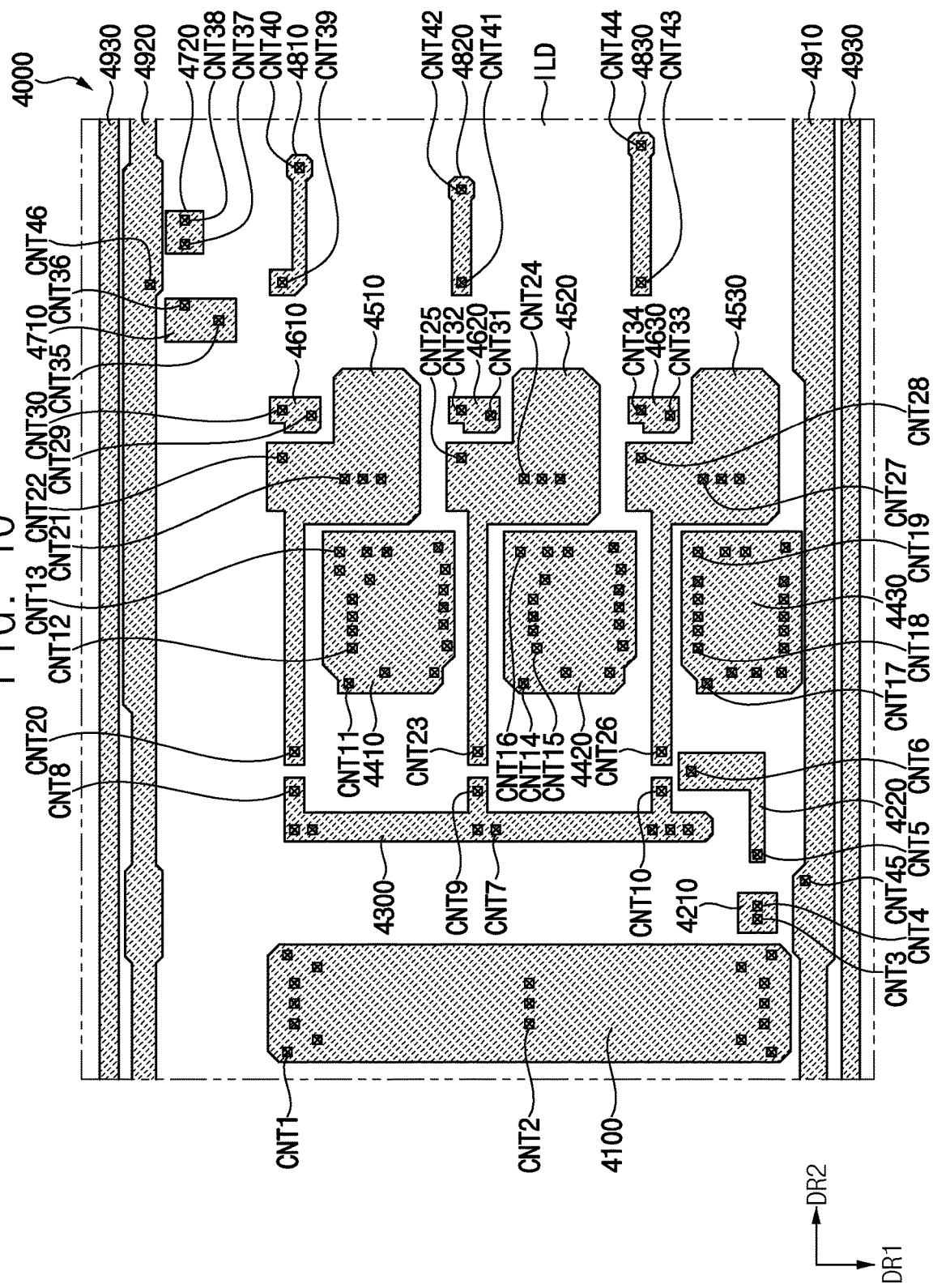
Figure 11:
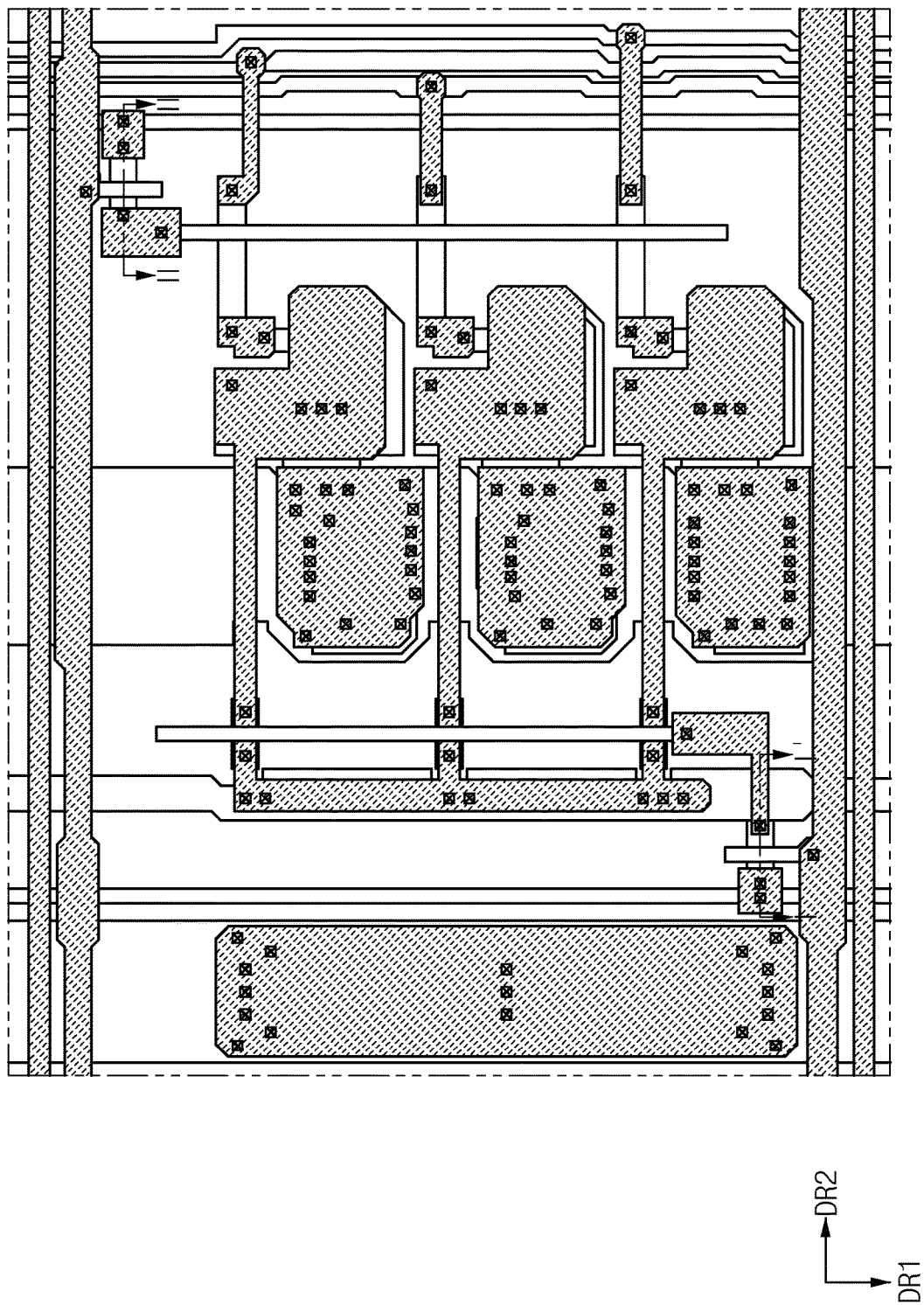

Referring to FIGS. 3, 5, and 12, a lower conductive layer 1000 may be located on the substrate SUB.

The lower conductive layer 1000 may include a common voltage line 1100, an initialization voltage line 1200, a driving voltage line 1300, a first capacitor pattern 1410, a second capacitor pattern 1420, a third capacitor pattern 1430, a first data line 1510, a second data line 1520, and a third data line 1530.

The common voltage line 1100 may extend in the first direction DR1. The common voltage ELVSS may be applied to the common voltage line 1100.

The initialization voltage line 1200 may be spaced apart from the common voltage line 1100 in the second direction DR2, and may extend in the first direction DR1. The initialization voltage VINT may be applied to the initialization voltage line 1200.

The driving voltage line 1300 may be spaced apart from the initialization voltage line 1200 in the second direction DR2, and may extend in the first direction DR1. The driving voltage ELVDD may be applied to the driving voltage line 1300.

The first capacitor pattern 1410, the second capacitor pattern 1420, and the third capacitor pattern 1430 may be spaced apart from the driving voltage line 1300 in the second direction DR2, and may be arranged along the first direction DR1.

In one or more embodiments, each of the first, second, and third capacitor patterns 1410, 1420, and 1430 may be electrically connected to the initialization voltage line 1200. For example, a portion of each of the first, second, and third capacitor patterns 1410, 1420, and 1430 may correspond to the second terminal of the storage capacitor CST included in the sub-pixel SPX described with reference to FIG. 3.

The first data line 1510 may be spaced apart from the first, second, and third capacitor patterns 1410, 1420, and 1430 in the second direction DR2, and may extend in the first direction DR1. The second data line 1520 may be spaced apart from the first data line 1510 in the second direction DR2, and may extend in the first direction DR1. The third data line 1530 may be spaced apart from the second data line 1520 in the second direction DR2, and may extend in the first direction DR1. The data voltage DATA may be applied to each of the first, second, and third data lines 1510, 1520, and 1530.

The first data line 1510 may be electrically connected to a second sub-pixel (e.g., the second sub-pixel SPX2 of FIG. 1). The second data line 1520 may be electrically connected to a first sub-pixel (e.g., the first sub-pixel SPX1 of FIG. 1). The third data line 1530 may be electrically connected to a third sub-pixel (e.g., the third sub-pixel SPX3 of FIG. 1).

However, respective connection relationships between the first, second, and third data lines 1510, 1520, and 1530 and the first, second, and third sub-pixels are not limited thereto. The connection relationship between the first, second, and third data lines 1510, 1520, and 1530 and the first, second, and third sub-pixels may be appropriately set as needed.

The lower conductive layer 1000 may include a conductive material, such as a metal, an alloy, a conductive metal oxide, a transparent conductive material, or the like. Examples of the conductive material may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the lower conductive layer 1000 may be composed of a single layer or multiple layers.

Referring to FIGS. 3, 4, 5, 6, 7, 12, and 13, the buffer layer BFR may be located on the lower conductive layer 1000, and may cover the lower conductive layer 1000. An active layer 2000 may be located on the buffer layer BFR.

The active layer 2000 may include a first output active pattern 2100, a first initialization active pattern 2210, a second initialization active pattern 2220, a third initialization active pattern 2230, a first driving active pattern 2310, a second driving active pattern 2320, a third driving active pattern 2330, a first switching active pattern 2410, a second switching active pattern 2420, a third switching active pattern 2430, and a second output active pattern 2500.

The first output active pattern 2100 may be located between the common voltage line 1100 and the initialization voltage line 1200 in a plan view. For example, a portion of the first output active pattern 2100 may correspond to the first terminal and the second terminal of the fifth transistor T5 included in the sub-pixel SPX described with reference to FIG. 3.

The first initialization active pattern 2210, the second initialization active pattern 2220, and the third initialization active pattern 2230 may be located between the initialization voltage line 1200 and the driving voltage line 1300 in a plan view, and may be arranged along the first direction DR1.

In one or more embodiments, each of the first, second, and third initialization active patterns 2210, 2220, and 2230 may be electrically connected to the initialization voltage line 1200. For example, a portion of each of the first, second, and third initialization active patterns 2210, 2220, and 2230 may correspond to the first terminal and the second terminal of the third transistor T3 included in the sub-pixel SPX described with reference to FIG. 3.

The first driving active pattern 2310, the second driving active pattern 2320, and the third driving active pattern 2330 may at least partially overlap the driving voltage line 1300 in a plan view, and may be arranged along the first direction DR1. In addition, the first, second, and third driving active patterns 2310, 2320, and 2330 may overlap the first, second, and third capacitor patterns 1410, 1420, and 1430 in a plan view, respectively.

In one or more embodiments, each of the first, second, and third driving active patterns 2310, 2320, and 2330 may be electrically connected to the driving voltage line 1300. For example, a portion of each of the first, second, and third driving active patterns 2310, 2320, and 2330 may correspond to the first terminal and the second terminal of the first transistor T1 included in the sub-pixel SPX described with reference to FIG. 3.

The first switching active pattern 2410, the second switching active pattern 2420, and the third switching active pattern 2430 may be located between the driving voltage line 1300 and the first data line 1510 in a plan view, and may be arranged along the first direction DR1.

For example, the first switching active pattern 2410 may be located between the first capacitor pattern 1410 and the first data line 1510 in a plan view. The second switching active pattern 2420 may be located between the second capacitor pattern 1420 and the first data line 1510 in a plan view. The third switching active pattern 2430 may be located between the third capacitor pattern 1430 and the first data line 1510 in a plan view.

In one or more embodiments, the first switching active pattern 2410 may be electrically connected to the second data line 1520. The second switching active pattern 2420 may be electrically connected to the first data line 1510. The third switching active pattern 2430 may be electrically connected to the third data line 1530. For example, a portion of each of the first, second, and third switching active patterns 2410, 2420, and 2430 may correspond to the first terminal and the second terminal of the second transistor T2 included in the sub-pixel SPX described with reference to FIG. 3.

The second output active pattern 2500 may be located between the driving voltage line 1300 and the first data line 1510 in a plan view, and may be spaced apart from the first output active pattern 2100. For example, a portion of the second output active pattern 2500 may correspond to the first terminal and the second terminal of the fourth transistor T4 included in the sub-pixel SPX described with reference to FIG. 3.

The active layer 2000 may include a silicon semiconductor material or an oxide semiconductor material. Examples of the silicon semiconductor material may include amorphous silicon, polycrystalline silicon, or the like. Examples of the oxide semiconductor material may include indium gallium zinc oxide, indium tin zinc oxide, or the like. These may be used alone or in combination with each other.

Referring to FIGS. 2, 3, 4, 5, 6, 8, 9, 12, and 13, the gate-insulating layer GI may be located on the buffer layer BFR and the active layer 2000. A first conductive layer 3000 may be located on the gate-insulating layer GI.

The first conductive layer 3000 may include a first conductive pattern 3100, a first output gate line 3210, a first output gate pattern 3220, an initialization gate line 3300, a second conductive pattern 3410, a third conductive pattern 3420, a fourth conductive pattern 3430, a first driving gate pattern 3510, a second driving gate pattern 3520, a third driving gate pattern 3530, a switching gate line 3600, a second output gate pattern 3710, and a second output gate line 3720.

The first conductive pattern 3100 may overlap the common voltage line 1100 in a plan view. The first conductive pattern 3100 may be electrically connected to the common voltage line 1100, and may reduce electrical resistance of the common voltage line 1100. Accordingly, a voltage drop of the common voltage ELVSS may be reduced or prevented.

Each of the first output gate line 3210 and the first output gate pattern 3220 may be located between the common voltage line 1100 and the initialization voltage line 1200 in a plan view.

The first output gate line 3210 may be spaced apart from the first conductive pattern 3100 in the second direction DR2, and may extend in the first direction DR1.

In one or more embodiments, the first output gate line 3210 may be directly connected to the scan driver SDV. The sensing clock signal SS_CK generated from the scan driver SDV may be applied to the first output gate line 3210. For example, the first output gate line 3210 may correspond to the second scan line SL2 described with reference to FIG. 2.

The first output gate pattern 3220 may be spaced apart from the first output gate line 3210 in the second direction DR2. The first output gate pattern 3220 may at least partially overlap the first output active pattern 2100 in a plan view.

In one or more embodiments, the voltage VQN of the Q node may be applied to the first output gate pattern 3220. For example, a portion of the first output gate pattern 3220 may correspond to the gate terminal of the fifth transistor T5 included in the sub-pixel SPX described with reference to FIG. 3. Accordingly, the first output active pattern 2100 and a portion of the first output gate pattern 3220 that overlaps the first output active pattern 2100 may define the fifth transistor T5.

The initialization gate line 3300 may be spaced apart from the first output gate line 3210 in the second direction DR2, and may extend in the first direction DR1. The initialization gate line 3300 may overlap the first, second, and third initialization active patterns 2210, 2220, and 2230 in a plan view.

In one or more embodiments, the sensing signal SS may be applied to the initialization gate line 3300. For example, a portion of the initialization gate line 3300 may correspond to the gate terminal of the third transistor T3 included in the sub-pixel SPX described with reference to FIG. 3. Accordingly, the first, second, and third initialization active patterns 2210, 2220, and 2230, and portions of the initialization gate line 3300 that overlap each of the first, second, and third initialization active patterns 2210, 2220, and 2230, may define the third transistor T3.

The second conductive pattern 3410, the third conductive pattern 3420, and the fourth conductive pattern 3430 may be spaced apart from the initialization gate line 3300 in the second direction DR2, and may be arranged along the first direction DR1. The second, third, and fourth conductive patterns 3410, 3420, and 3430 may overlap the driving voltage line 1300 in a plan view. The second, third, and fourth conductive patterns 3410, 3420, and 3430 may be electrically connected to the driving voltage line 1300, and may reduce electrical resistance of the driving voltage line 1300. Accordingly, a voltage drop of the driving voltage ELVDD may be reduced or prevented.

The first driving gate pattern 3510, the second driving gate pattern 3520, and the third driving gate pattern 3530 may be spaced apart from the second, third, and fourth conductive patterns 3410, 3420, and 3430 in the second direction DR2, and may be arranged along the first direction DR1.

The first, second, and third driving gate patterns 3510, 3520, and 3530 may at least partially overlap the first, second, and third driving active patterns 2310, 2320, and 2330 in a plan view, respectively.

In one or more embodiments, the first driving gate pattern 3510 may be electrically connected to the first driving active pattern 2310 and the first switching active pattern 2410. The second driving gate pattern 3520 may be electrically connected to the second driving active pattern 2320 and the second switching active pattern 2420. The third driving gate pattern 3530 may be electrically connected to the third driving active pattern 2330 and the third switching active pattern 2430.

For example, a portion of each of the first, second, and third driving gate patterns 3510, 3520, and 3530 may correspond to the gate terminal of the first transistor T1 included in the sub-pixel SPX described with reference to FIG. 3. Accordingly, the first, second, and third driving active patterns 2310, 2320, and 2330 and portions of the first, second, and third driving gate patterns 3510, 3520, and 3530 that overlap the first, second, and third driving active patterns 2310, 2320, and 2330, respectively, may define the first transistor T1.

In one or more embodiments, the first driving gate pattern 3510 may overlap the first capacitor pattern 1410 in a plan view. The first driving gate pattern 3510, together with the first capacitor pattern 1410, may define the storage capacitor CST. The second driving gate pattern 3520 may overlap the second capacitor pattern 1420 in plan view, and may define the storage capacitor CST together with the second capacitor pattern 1420. The third driving gate pattern 3530 may overlap the third capacitor pattern 1430 in a plan view, and may define the storage capacitor CST together with the third capacitor pattern 1430. For example, a portion of each of the first, second, and third driving gate patterns 3510, 3520, and 3530 may correspond to the first terminal of the storage capacitor CST included in the sub-pixel SPX described with reference to FIG. 3.

The switching gate line 3600 may be spaced apart from the first, second, and third driving gate patterns 3510, 3520, and 3530 in the second direction DR2, and may extend in the first direction DR1. The switching gate line 3600 may overlap the first, second, and third switching active patterns 2410, 2420, and 2430 in a plan view.

In one or more embodiments, the scan signal SC may be applied to the switching gate line 3600. For example, a portion of the switching gate line 3600 may correspond to the gate terminal of the second transistor T2 included in the sub-pixel SPX described with reference to FIG. 3. Accordingly, the first, second, and third switching active patterns 2410, 2420, and 2430 and a portion of the switching gate line 3600 that overlaps each of the first, second, and third switching active patterns 2410, 2420, and 2430 may define the second transistor T2.

Each of the second output gate pattern 3710 and the second output gate line 3720 may be located between the driving voltage line 1300 and the first data line 1510 in a plan view.

The second output gate pattern 3710 may be spaced apart from the switching gate line 3600 in the second direction DR2. The second output gate pattern 3710 may at least partially overlap the second output active pattern 2500 in a plan view.

In one or more embodiments, the voltage VQN of the Q node may be applied to the second output gate pattern 3710. For example, a portion of the second output gate pattern 3710 may correspond to the gate terminal of the fourth transistor T4 included in the sub-pixel SPX described with reference to FIG. 3. Accordingly, the second output active pattern 2500 and a portion of the second output gate pattern 3710 that overlaps the second output active pattern 2500 may define the fourth transistor T4.

The second output gate line 3720 may be spaced apart from the second output gate pattern 3710 in the second direction DR2, and may extend in the first direction DR1.

In one or more embodiments, the second output gate line 3720 may be directly connected to the scan driver SDV. The scan clock signal SC_CK generated from the scan driver SDV may be applied to the second output gate line 3720. For example, the second output gate line 3720 may correspond to the second scan line SL2 described with reference to FIG. 2.

The first conductive layer 3000 may include a conductive material, such as a metal, alloy, conductive metal oxide, transparent conductive material, or the like. Examples of the conductive material may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the first conductive layer 3000 may be composed of a single layer or multiple layers.

Referring to FIGS. 2, 3, 4, 5, 6, 8, 10, to 13, the interlayer insulating layer ILD may be located on the first conductive layer 3000, and may cover the first conductive layer 3000. A second conductive layer 4000 may be located on the interlayer insulating layer ILD.

The second conductive layer 4000 may include a common voltage connection pattern 4100, a first connection pattern 4210, a second connection pattern 4220, an initialization voltage connection pattern 4300, a first driving voltage connection pattern 4410, a second driving voltage connection pattern 4420, a third driving voltage connection pattern 4430, a first anode pattern 4510, a second anode pattern 4520, a third anode pattern 4530, a third connection pattern 4610, a fourth connection pattern 4620, a fifth connection pattern 4630, a sixth connection pattern 4710, a seventh connection pattern 4720, a first data pattern 4810, a second data pattern 4820, a third data pattern 4830, a first connection line 4910, a second connection line 4920, and auxiliary lines 4930.

The common voltage connection pattern 4100 may overlap the common voltage line 1100 and the first conductive pattern 3100 in a plan view. The common voltage connection pattern 4100 may contact the common voltage line 1100 through a first contact hole CNT1, and may contact the first conductive pattern 3100 through a second contact hole CNT2.

The first connection pattern 4210 may be spaced apart from the common voltage connection pattern 4100 in the second direction DR2. The first connection pattern 4210 may contact the first output gate line 3210 through a third contact hole CNT3, and may contact the first output active pattern 2100 through a fourth contact hole CNT4. Accordingly, the first connection pattern 4210 may electrically connect the first output active pattern 2100 and the first output gate line 3210. The first connection pattern 4210 may transmit the sensing clock signal SS_CK from the first output gate line 3210 to the first output active pattern 2100.

The second connection pattern 4220 may be spaced apart from the first connection pattern 4210 in the second direction DR2. The second connection pattern 4220 may contact the first output active pattern 2100 through a fifth contact hole CNT5, and may contact the initialization gate line 3300 through a sixth contact hole CNT6. Accordingly, the second connection pattern 4220 may electrically connect the first output active pattern 2100 and the initialization gate line 3300. The second connection pattern 4220 may transmit the sensing signal SS from the first output active pattern 2100 to the initialization gate line 3300.

The initialization voltage connection pattern 4300 may be spaced apart from the common voltage connection pattern 4100 in the second direction DR2. The initialization voltage connection pattern 4300 may contact the initialization voltage line 1200 through a seventh contact hole CNT7, and may contact the first, second, and third initialization active patterns 2210, 2220, and 2230 through eighth, ninth and tenth contact holes CNT8, CNT9, and CNT10, respectively. The initialization voltage connection pattern 4300 may transmit the initialization voltage VINT from the initialization voltage line 1200 to each of the first, second, and third initialization active patterns 2210, 2220, and 2230.

The first driving voltage connection pattern 4410, the second driving voltage connection pattern 4420, and the third driving voltage connection pattern 4430 may be spaced apart from the initialization voltage connection pattern 4300 in the second direction DR2, and may be arranged along the first direction DR1.

The first driving voltage pattern 4410 may contact the driving voltage line 1300 through an eleventh contact hole CNT11, may contact the second conductive pattern 3410 through a twelfth contact hole CNT12, and may contact the first driving active pattern 2310 through a thirteenth contact hole CNT13. The second driving voltage pattern 4420 may contact the driving voltage line 1300 through a fourteenth contact hole CNT14, may contact the third conductive pattern 3420 through a fifteenth contact hole CNT15, and may contact the second driving active pattern 2320 through a sixteenth contact hole CNT16. The third driving voltage pattern 4430 may contact the driving voltage line 1300 through a seventeenth contact hole CNT17, may contact the fourth conductive pattern 3430 through an eighteenth contact hole CNT18, and may contact the third driving active pattern 2330 through a nineteenth contact hole CNT19. The first, second, and third driving voltage connection patterns 4410, 4420, and 4430 may transmit the driving voltage ELVDD from the driving voltage line 1300 to the first, second, and third driving active patterns 2310, 2320, and 2330, respectively.

The first anode pattern 4510, the second anode pattern 4520, and the third anode pattern 4530 may be spaced apart from the first, second, and third driving voltage connection patterns 4410, 4420, and 4430 in the second direction DR2, and may be arranged along the first direction DR1.

The first anode pattern 4510 may contact the first initialization active pattern 2210 through a twentieth contact hole CNT20, may contact the first driving active pattern 2310 through a twenty-first contact hole CNT21, and may contact the first capacitor pattern 1410 through a twenty-second contact hole CNT22. The second anode pattern 4520 may contact the second initialization active pattern 2220 through a twenty-third contact hole CNT23, may contact the second driving active pattern 2320 through a twenty-fourth contact hole CNT24, and may contact the second capacitor pattern 1420 through a twenty-fifth contact hole CNT25. The third anode pattern 4530 may contact the third initialization active pattern 2230 through a twenty-sixth contact hole CNT26, may contact the third driving active pattern 2330 through a twenty-seventh contact hole CNT27, and may contact the third capacitor pattern 1430 through a twenty-eighth contact hole CNT28. The first, second, and third anode patterns 4510, 4520, and 4530 may transmit the initialization voltage VINT from the first, second, and third initialization active patterns 2210, 2220, and 2230 to the first, second, and third capacitor patterns 1410, 1420, and 1430, respectively.

The third connection pattern 4610, the fourth connection pattern 4620, and the fifth connection pattern 4630 may be spaced apart from the first, second, and third anode patterns 4510, 4520, and 4530 in the second direction DR2, and may be arranged along the first direction DR1.

The third connection pattern 4610 may contact the first driving gate pattern 3510 through a twenty-ninth contact hole CNT29, and may contact the first switching active pattern 2410 through a thirtieth contact hole CNT30. The fourth connection pattern 4620 may contact the second driving gate pattern 3520 through a thirty-first contact hole CNT31, and may contact the second switching active pattern 2420 through a thirty-second contact hole CNT32. The fifth connection pattern 4630 may contact the third driving gate pattern 3530 through a 33rd contact hole CNT33, and may contact the third switching active pattern 2430 through a thirty-fourth contact hole CNT34. The third, fourth, and fifth connection patterns 4610, 4620, and 4630 may transmit the data voltage DATA from the first, second, and third switching active patterns 2410, 2420, and 2430 to the first, second, and third driving gate patterns 3510, 3520, and 3530, respectively.

The sixth connection pattern 4710 may contact the switching gate line 3600 through a thirty-fifth contact hole CNT35, and may contact the second output active pattern 2500 through a thirty-sixth contact hole CNT36. Accordingly, the sixth connection pattern 4710 may electrically connect the second output active pattern 2500 and the switching gate line 3600. The sixth connection pattern 4710 may transmit the scan signal SC from the second output active pattern 2500 to the switching gate line 3600.

The seventh connection pattern 4720 may be spaced apart from the sixth connection pattern 4710 in the second direction DR2. The seventh connection pattern 4720 may contact the second output active pattern 2500 through a thirty-seventh contact hole CNT37, and may contact the second output gate line 3720 through a thirty-eighth contact hole CNT38. Accordingly, the seventh connection pattern 4720 may electrically connect the second output active pattern 2500 and the second output gate line 3720. The seventh connection pattern 4720 may transmit the scan clock signal SC_CK from the second output gate line 3720 to the second output active pattern 2500.

The first data pattern 4810, the second data pattern 4820, and the third data pattern 4830 may be spaced apart from the third, fourth, and fifth connection patterns 4610, 4620 and 4630 in the second direction DR2, and may be arranged along the first direction DR1.

The first data pattern 4810 may contact the first switching active pattern 2410 through a thirty-ninth contact hole CNT39, and may contact the second data line 1520 through a fortieth contact hole CNT40. The second data pattern 4820 may contact the second switching active pattern 2420 through a forty-first contact hole CNT41, and may contact the first data line 1510 through a forty-second contact hole CNT42. The third data pattern 4830 may contact the third switching active pattern 2430 through a forty-third contact hole CNT43, and may contact the third data line 1530 through a forty-fourth contact hole CNT44. The first, second, and third data patterns 4810, 4820, and 4830 may transmit the data voltage DATA from the first, second, and third data lines 1510, 1520, and 1530 to the first, second, and third switching active patterns 2410, 2420, and 2430, respectively.

The first connection line 4910 may be spaced apart from the third data pattern 4830 in the first direction DR1, and may extend in the second direction DR2. The first connection line 4910 may at least partially overlap each of the first output gate line 3210 and the first output gate pattern 3220 in a plan view. In addition, the first connection line 4910 may be spaced apart from the initialization gate line 3300 in a plan view. In one or more embodiments, the first connection line 4910 may contact the first output gate pattern 3220 through a forty-fifth contact hole CNT45. The first connection line 4910 may transmit the voltage VQN of the Q node to the first output gate pattern 3220. For example, the first connection line 4910 may correspond to the first scan line SL1 described with reference to FIG. 2.

The second connection line 4920 may be spaced apart from the first connection line 4910 in a direction opposite to the first direction DR1, and may extend in the second direction DR2. The second connection line 4920 may at least partially overlap each of the second output gate pattern 3710 and the second output gate line 3720 in a plan view. In addition, the second connection line 4920 may be spaced apart from the switching gate line 3600 in a plan view. In one or more embodiments, the second connection line 4920 may contact the second output gate pattern 3710 through a forty-sixth contact hole CNT46. The second connection line 4920 may transmit the voltage VQN of the Q node to the second output gate pattern 3710. For example, the second connection line 4920 may correspond to the first scan line SL1 described with reference to FIG. 2.

Each of the auxiliary lines 4930 may extend in the second direction DR2. One of the auxiliary lines 4930 may be adjacent to the first connection line 4910, and the other one of the auxiliary lines 4930 may be adjacent to the second connection line 4920. In addition, one of the auxiliary lines 4930 may be electrically connected to the common voltage line 1100, and the other one of the auxiliary lines 4930 may be electrically connected to the driving voltage line 1300.

The second conductive layer 4000 may include a conductive material, such as a metal, alloy, conductive metal oxide, transparent conductive material, or the like. Examples of the conductive material may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like. These may be used alone or in combination with each other. In addition, the second conductive layer 4000 may be composed of a single layer or multiple layers.

The via insulating layer VIA may be located on the second conductive layer 4000, and may cover the second conductive layer 4000. The light-emitting diode LD, a pixel-defining layer (e.g., the pixel-defining layer PDL in FIG. 4) and an encapsulation layer (e.g., the encapsulation layer TFE in FIG. 4) may be sequentially located on the via insulating layer VIA.

The display device DD according to one or more embodiments of the present disclosure may include the pixels PX each including the fourth transistor T4 that outputs the scan signal SC that corresponds to the scan clock signal SC_CK in response to the voltage VQN of the Q node and the fifth transistor T5 that outputs the sensing signal SS that corresponds to the sensing clock signal SS_CK in response to the voltage VQN of the Q node. Because each of the pixels PX includes the transistors T4 and T5 that respectively output the scan signal SC and the sensing signal SS, the scan driver SDV may include a relatively small number of transistors, and an area occupied by the scan driver SDV may be reduced. Accordingly, an area of the non-display area NDA where the scan driver SDV is located may be reduced, and thus a dead space of the display device may be reduced.

The present disclosure can be applied to various display devices. For example, the present disclosure is applicable to various display devices, such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, with functional equivalents thereof to be included therein.

What is claimed is:

1. A pixel comprising:
   a pixel circuit located in a display area; and
   a light-emitting diode electrically connected to the pixel circuit,
   wherein the pixel circuit comprises:
   a first transistor comprising a first terminal configured to receive a driving voltage, a second terminal connected to the light-emitting diode, and a gate terminal connected to a node;
   a second transistor comprising a first terminal configured to receive a data voltage, a second terminal connected to the node, and a gate terminal configured to receive a scan signal;
   a third transistor comprising a first terminal configured to receive an initialization voltage, a second terminal connected to the light-emitting diode, and a gate terminal configured to receive a sensing signal; and
   a fourth transistor comprising a first terminal configured to receive a scan clock signal, a second terminal connected to the gate terminal of the second transistor, and a gate terminal configured to receive a voltage of a Q node, and
   wherein the scan clock signal, a sensing clock signal, and the voltage of the Q node are received from a scan driver located in a non-display area surrounding the display area.

2. The pixel of claim 1, wherein the fourth transistor is configured to output the scan signal that corresponds to the scan clock signal in response to the voltage of the Q node.

3. The pixel of claim 2, wherein the second terminal of the fourth transistor is directly connected to the gate terminal of the second transistor.

4. The pixel of claim 1, wherein the pixel circuit further comprises a fifth transistor comprising a first terminal configured to receive the sensing clock signal, a second terminal connected to the gate terminal of the third transistor, and a gate terminal configured to receive the voltage of the Q node.

5. The pixel of claim 4, wherein the fifth transistor is configured to output the sensing signal that corresponds to the sensing clock signal in response to the voltage of the Q node.

6. The pixel of claim 5, wherein the second terminal of the fifth transistor is directly connected to the gate terminal of the third transistor.

* * * * *